United States Patent
Briggs (10) Patent No.: US 9,347,631 B2
(45) Date of Patent: *May 24, 2016

(54) MODULAR LED STRIP LIGHTING APPARATUS

(71) Applicant: ARKALUMEN INC., Ottawa (CA)

(72) Inventor: Gerald Edward Briggs, Ottawa (CA)

(73) Assignee: ARKALUMEN, INC., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/606,013

(22) Filed: Jan. 26, 2015

(65) Prior Publication Data

US 2015/0241006 A1    Aug. 27, 2015

Related U.S. Application Data

(63) Continuation of application No. 13/423,142, filed on Mar. 16, 2012, now Pat. No. 8,939,604.

(60) Provisional application No. 61/467,914, filed on Mar. 25, 2011.

(51) Int. Cl.
| | |
|---|---|
| *F21S 9/00* | (2006.01) |
| *H01L 33/48* | (2010.01) |
| *H05B 37/02* | (2006.01) |
| *H05B 33/08* | (2006.01) |
| *F21S 4/00* | (2016.01) |
| *H01L 25/075* | (2006.01) |

(Continued)

(52) U.S. Cl.
CPC . *F21S 4/003* (2013.01); *F21K 9/50* (2013.01); *F21S 4/20* (2016.01); *F21V 23/005* (2013.01); *F21V 23/04* (2013.01); *H01L 25/0753* (2013.01); *H05B 33/0803* (2013.01); *H05B 33/0845* (2013.01); *H05K 1/05* (2013.01); *F21Y 2101/02* (2013.01); *F21Y 2105/001* (2013.01); *H01L 33/62* (2013.01); *H01L 2924/0002* (2013.01); *H05K 2201/09309* (2013.01); *H05K 2201/09972* (2013.01); *H05K 2201/10106* (2013.01)

(58) Field of Classification Search
CPC ............... H01L 25/0753; H01L 2224/73265; F21Y 2105/001; F21Y 2103/003; F21Y 2113/005; G02F 1/133603; G02F 1/133606; G02F 1/133621; G02F 2001/133622; H05B 33/0815; H05B 33/0827; H05B 33/0842; H05B 37/02; H05B 33/0845; Y02B 20/346; H05K 2201/10106; H05K 1/142; H05K 1/181; H05K 3/0058; F21V 5/04; F21V 29/89; F21S 4/008; G02B 6/0073
See application file for complete search history.

(56) References Cited

U.S. PATENT DOCUMENTS

| | | |
|---|---|---|
| 4,593,234 A | 6/1986 | Yang |
| 5,006,782 A | 4/1991 | Pelly |

(Continued)

FOREIGN PATENT DOCUMENTS

WO    WO-0113038 A1    2/2001

*Primary Examiner* — Vibol Tan
(74) *Attorney, Agent, or Firm* — Murray IP Consulting Inc; Sean Murray (57) ABSTRACT

A LED based lighting apparatus is disclosed. The light engine used in the lighting apparatus may use a multi-layer metal core printed circuit board and have a plurality of LED groups that are independently controllable by a control unit. The power supply input and return paths connected to each LED group may be implemented on different layers to allow a compact footprint that may be used with traditional fluorescent encasements with relatively little modification.

20 Claims, 8 Drawing Sheets

(51) Int. Cl.
*H05K 1/05* (2006.01)
*F21K 99/00* (2016.01)
*F21V 23/00* (2015.01)
*F21V 23/04* (2006.01)
*H01L 33/62* (2010.01)
*F21Y 101/02* (2006.01)
*F21Y 105/00* (2016.01)

(56) References Cited

U.S. PATENT DOCUMENTS

| | | |
|---|---|---|
| 5,237,264 A | 8/1993 | Moseley et al. |
| 5,248,919 A | 9/1993 | Hanna et al. |
| 5,783,909 A | 7/1998 | Hochstein |
| 5,803,579 A | 9/1998 | Turnbull et al. |
| 5,932,995 A | 8/1999 | Wagoner |
| 5,949,539 A | 9/1999 | Britton, Jr. et al. |
| 6,127,798 A | 10/2000 | Lansang et al. |
| 6,150,774 A | 11/2000 | Mueller et al. |
| 6,175,195 B1 | 1/2001 | Janczak et al. |
| 6,198,230 B1 | 3/2001 | Leeb et al. |
| 6,222,352 B1 | 4/2001 | Lenk |
| 6,307,331 B1 | 10/2001 | Bonasia |
| 6,351,079 B1 | 2/2002 | Willis |
| 6,400,482 B1 | 6/2002 | Lupton et al. |
| 6,426,599 B1 | 7/2002 | Leeb |
| 6,441,558 B1 | 8/2002 | Muthu |
| 6,445,139 B1 | 9/2002 | Marshall et al. |
| 6,495,964 B1 | 12/2002 | Muthu et al. |
| 6,504,633 B1 | 1/2003 | Hovorka et al. |
| 6,518,561 B1 | 2/2003 | Miura |
| 6,548,967 B1 | 4/2003 | Dowling et al. |
| 6,596,977 B2 | 7/2003 | Muthu et al. |
| 6,621,235 B2 | 9/2003 | Chang |
| 6,794,831 B2 | 9/2004 | Leeb et al. |
| 6,798,152 B2 * | 9/2004 | Rooke ............... H05B 33/0815 315/209 R |
| 6,853,150 B2 | 2/2005 | Clauberg et al. |
| 6,894,442 B1 | 5/2005 | Lim et al. |
| 6,954,591 B2 | 10/2005 | Lupton et al. |
| 7,016,115 B1 | 3/2006 | Leeb et al. |
| 7,141,779 B1 | 11/2006 | Chew et al. |
| 7,233,115 B2 | 6/2007 | Lys |
| 7,256,554 B2 | 8/2007 | Lys |
| 7,265,681 B2 | 9/2007 | Chen |
| 7,321,203 B2 | 1/2008 | Marosek |
| 7,352,135 B2 | 4/2008 | Shiotsu et al. |
| 7,457,089 B2 | 11/2008 | Ohshima |
| 7,486,032 B2 | 2/2009 | Lee |
| 7,495,425 B2 | 2/2009 | Friedrich |
| 7,498,754 B2 | 3/2009 | Masood |
| 7,511,463 B2 | 3/2009 | Kumar |
| 7,633,577 B2 | 12/2009 | Moon et al. |
| 7,649,326 B2 | 1/2010 | Johnson et al. |
| 7,683,470 B2 | 3/2010 | Lee et al. |
| 7,683,504 B2 | 3/2010 | Blair et al. |
| 7,750,616 B2 | 7/2010 | Liu |
| 7,759,881 B1 | 7/2010 | Melanson |
| 7,847,783 B2 | 12/2010 | Liu et al. |
| 8,105,854 B2 | 1/2012 | Lee et al. |
| 8,193,737 B2 | 6/2012 | Peker et al. |
| 8,232,742 B2 | 7/2012 | Briggs |
| 8,247,975 B2 | 8/2012 | Yoo et al. |
| 8,248,439 B2 | 8/2012 | Ran et al. |
| 8,324,834 B2 | 12/2012 | Wang et al. |
| 8,358,085 B2 | 1/2013 | Catalano et al. |
| 8,587,203 B2 | 11/2013 | Chen et al. |
| 8,766,162 B2 | 7/2014 | Tanase |
| 2004/0119602 A1 | 6/2004 | Blum et al. |
| 2004/0263093 A1 | 12/2004 | Matsubayashi et al. |
| 2005/0127888 A1 | 6/2005 | Marschalkowski et al. |
| 2005/0156644 A1 | 7/2005 | Karnahan et al. |
| 2005/0173924 A1 | 8/2005 | French |
| 2005/0199841 A1 | 9/2005 | O'Maley et al. |
| 2005/0225264 A1 | 10/2005 | Kemp |
| 2005/0269580 A1 | 12/2005 | D'Angelo |
| 2006/0044800 A1 | 3/2006 | Reime |
| 2006/0049782 A1 | 3/2006 | Vomsand et al. |
| 2006/0113975 A1 | 6/2006 | Mednik et al. |
| 2006/0239689 A1 | 10/2006 | Ashdown |
| 2007/0080911 A1 * | 4/2007 | Liu .................. G09G 3/342 345/82 |
| 2007/0103086 A1 | 5/2007 | Neudorf et al. |
| 2007/0103832 A1 | 5/2007 | Ohshima |
| 2007/0159421 A1 | 7/2007 | Peker et al. |
| 2007/0182338 A1 | 8/2007 | Shteynberg et al. |
| 2007/0195552 A1 | 8/2007 | Park |
| 2007/0229047 A1 | 10/2007 | Sigamani et al. |
| 2007/0267978 A1 | 11/2007 | Shteynberg et al. |
| 2007/0268028 A1 | 11/2007 | Moyer et al. |
| 2007/0278974 A1 | 12/2007 | Van De Ven |
| 2008/0079705 A1 | 4/2008 | Yang et al. |
| 2008/0088769 A1 * | 4/2008 | Kim .................. G02B 6/0068 349/61 |
| 2008/0138085 A1 | 6/2008 | Lin et al. |
| 2008/0150449 A1 | 6/2008 | Wang et al. |
| 2008/0180040 A1 | 7/2008 | Prendergast et al. |
| 2008/0191642 A1 | 8/2008 | Slot et al. |
| 2008/0224636 A1 | 9/2008 | Melanson |
| 2008/0238341 A1 | 10/2008 | Korcharz et al. |
| 2008/0252664 A1 | 10/2008 | Huang et al. |
| 2008/0272277 A1 | 11/2008 | Wei |
| 2009/0027652 A1 | 1/2009 | Chang et al. |
| 2009/0096392 A1 | 4/2009 | Chandran et al. |
| 2009/0134817 A1 | 5/2009 | Jurngwirth et al. |
| 2009/0160422 A1 | 6/2009 | Isobe et al. |
| 2009/0167194 A1 | 7/2009 | Mizuta |
| 2009/0174337 A1 | 7/2009 | Miskin et al. |
| 2009/0195168 A1 | 8/2009 | Greenfield |
| 2009/0195183 A1 | 8/2009 | Yang |
| 2009/0251059 A1 | 10/2009 | Veltman |
| 2009/0251071 A1 | 10/2009 | Gater et al. |
| 2009/0322252 A1 | 12/2009 | Shiu et al. |
| 2010/0019692 A1 | 1/2010 | Kimura |
| 2010/0033146 A1 | 2/2010 | Irissou et al. |
| 2010/0033150 A1 | 2/2010 | Irissou et al. |
| 2010/0046210 A1 | 2/2010 | Mathai et al. |
| 2010/0060187 A1 | 3/2010 | Newman et al. |
| 2010/0066266 A1 | 3/2010 | Huang et al. |
| 2010/0072899 A1 | 3/2010 | Engstrand |
| 2010/0072902 A1 | 3/2010 | Wendt et al. |
| 2010/0079124 A1 | 4/2010 | Melanson |
| 2010/0100253 A1 | 4/2010 | Fausek et al. |
| 2010/0102230 A1 | 4/2010 | Chang et al. |
| 2010/0117450 A1 | 5/2010 | Azrai et al. |
| 2010/0164406 A1 | 7/2010 | Kost et al. |
| 2010/0171429 A1 | 7/2010 | Garcia et al. |
| 2010/0171442 A1 | 7/2010 | Draper et al. |
| 2010/0177127 A1 | 7/2010 | Akiyama et al. |
| 2010/0194308 A1 | 8/2010 | Zhao et al. |
| 2010/0264834 A1 | 10/2010 | Gaines et al. |
| 2010/0277075 A1 | 11/2010 | Rees |
| 2010/0289424 A1 | 11/2010 | Chang et al. |
| 2010/0302477 A1 | 12/2010 | Ohmi et al. |
| 2010/0320936 A1 | 12/2010 | Yao |
| 2010/0320939 A1 | 12/2010 | Lai |
| 2011/0006691 A1 | 1/2011 | Blaha et al. |
| 2011/0050130 A1 | 3/2011 | Rudolph |
| 2011/0068703 A1 | 3/2011 | McKinney |
| 2011/0086676 A1 | 4/2011 | Choi et al. |
| 2011/0101950 A1 | 5/2011 | Babb |
| 2011/0115394 A1 | 5/2011 | Shteynberg et al. |
| 2011/0115412 A1 | 5/2011 | Welten |
| 2011/0187313 A1 | 8/2011 | Lee |
| 2011/0193489 A1 | 8/2011 | Moss |
| 2011/0194047 A1 | 8/2011 | Bruyneel et al. |
| 2011/0227492 A1 | 9/2011 | Du et al. |
| 2011/0279040 A1 | 11/2011 | Briggs et al. |
| 2011/0279048 A1 | 11/2011 | Briggs |
| 2011/0279053 A1 | 11/2011 | Briggs |
| 2011/0279055 A1 | 11/2011 | Briggs |
| 2011/0279057 A1 | 11/2011 | Briggs |
| 2011/0298386 A1 | 12/2011 | Corradi |
| 2012/0146519 A1 | 6/2012 | Briggs |

(56) References Cited

U.S. PATENT DOCUMENTS

| | | |
|---|---|---|
| 2012/0262076 A1 | 10/2012 | Briggs |
| 2012/0268019 A1 | 10/2012 | Briggs |
| 2012/0312956 A1 | 12/2012 | Chang et al. |
| 2012/0320626 A1 | 12/2012 | Quillici et al. |
| 2013/0009561 A1 | 1/2013 | Briggs |
| 2013/0015774 A1 | 1/2013 | Briggs |
| 2013/0223058 A1 | 8/2013 | Briggs |
| 2013/0293722 A1 | 11/2013 | Chen |
| 2013/0297251 A1 | 11/2013 | Engel-Hall et al. |
| 2013/0300316 A1 | 11/2013 | Engel-Hall et al. |

* cited by examiner

MODULAR LED STRIP LIGHTING APPARATUS

CROSS-REFERENCE TO RELATED APPLICATION

The present application is a continuation of and claims the benefit under 35 USC 120 of U.S. patent application Ser. No. 13/423,142 entitled "MODULAR LED STRIP LIGHTING APPARATUS" by Briggs filed on Mar. 16, 2012 which claims the benefit under 35 USC 119(e) of U.S. Provisional Patent Application 61/467,914 filed on Mar. 25, 2011 and hereby incorporated by reference herein.

FIELD OF THE INVENTION

The present invention relates generally to a lighting apparatus, and more particularly to a strip lighting apparatus comprising a plurality of light emitting diodes.

BACKGROUND OF THE INVENTION

Fluorescent lighting systems are widely used and many fluorescent lighting systems are designed to accommodate long slender fluorescent tubes.

Recently, lighting systems employing light emitting diodes (LEDs) have increased in popularity. LED based lighting systems may be more efficient, have a longer lifespan, and be more controllable (e.g. colour, colour temperature) compared to traditional fluorescent lighting systems. However, many existing LED based lighting systems generate a relatively large amount of heat and certain LED based lighting systems require a large number of LEDs to achieve a desired lumen output. These factors may limit the layout of LEDs in LED based lighting systems and make it relatively difficult to modify the encasements used in fluorescent lighting systems for use with LEDs.

The present invention aims to mitigate at least one of the shortcomings of prior art lighting systems.

SUMMARY OF THE INVENTION

In an embodiment of the invention there is provided a light engine comprising: a metal core printed circuit board having a first interconnection layer and a second interconnection layer; a plurality of LED groups coupled in parallel in the first interconnection layer and coupled to a respective one of a plurality of return paths associated with the LED group in the second interconnection layer; each of the LED groups comprising a plurality of LED sets coupled in parallel in the first interconnection layer.

In another embodiment there is provided a light engine comprising: a metal core printed circuit board having a first interconnection layer and a second interconnection layer; a plurality of LED groups coupled in parallel to a return path in the first interconnection layer, each of the LED groups comprising a plurality of LED sets coupled in parallel in the first interconnection layer; and a plurality of power supply inputs in the second interconnection layer, each of the power supply inputs coupled to a respective one of the LED groups.

In another embodiment of the invention there is provided a light engine comprising: a metal core printed circuit board having a first interconnection layer and a second interconnection layer; a plurality of LED groups coupled in parallel between a power supply input and a plurality of layer interconnection elements in the first interconnection layer; each of the plurality of LED groups comprising: a return path coupled to the plurality of layer interconnection elements associated with the LED group in the second interconnection layer and a power supply return; and a plurality of LED sets coupled in parallel in the first interconnection layer, each of the LED sets comprising a plurality of LEDs coupled in series in the first interconnection layer between the power supply input and one of the layer interconnection elements.

In a further embodiment of the invention there is provided a light engine comprising: a metal core printed circuit board having a first interconnection layer and a second interconnection layer; a plurality of LED sets coupled in parallel in the first interconnection layer and coupled to a return path associated with the LED set in the second layer, each of the LED sets comprising a plurality of LEDs coupled in series in the first interconnection layer.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

The layout of LEDs in many LED based lighting systems may be limited by thermal management issues and ensuring that enough area remains to facilitate the required interconnections between LEDs where a large number of LEDs are used. Certain applications may employ metal core printed circuit boards (MCPCBs) to assist in managing the heat generated by a large number of LEDs. However, many existing designs suffer from certain shortcomings, including the ability to include a plurality of controllable LEDs in a narrow or small footprint.

Figure 1:
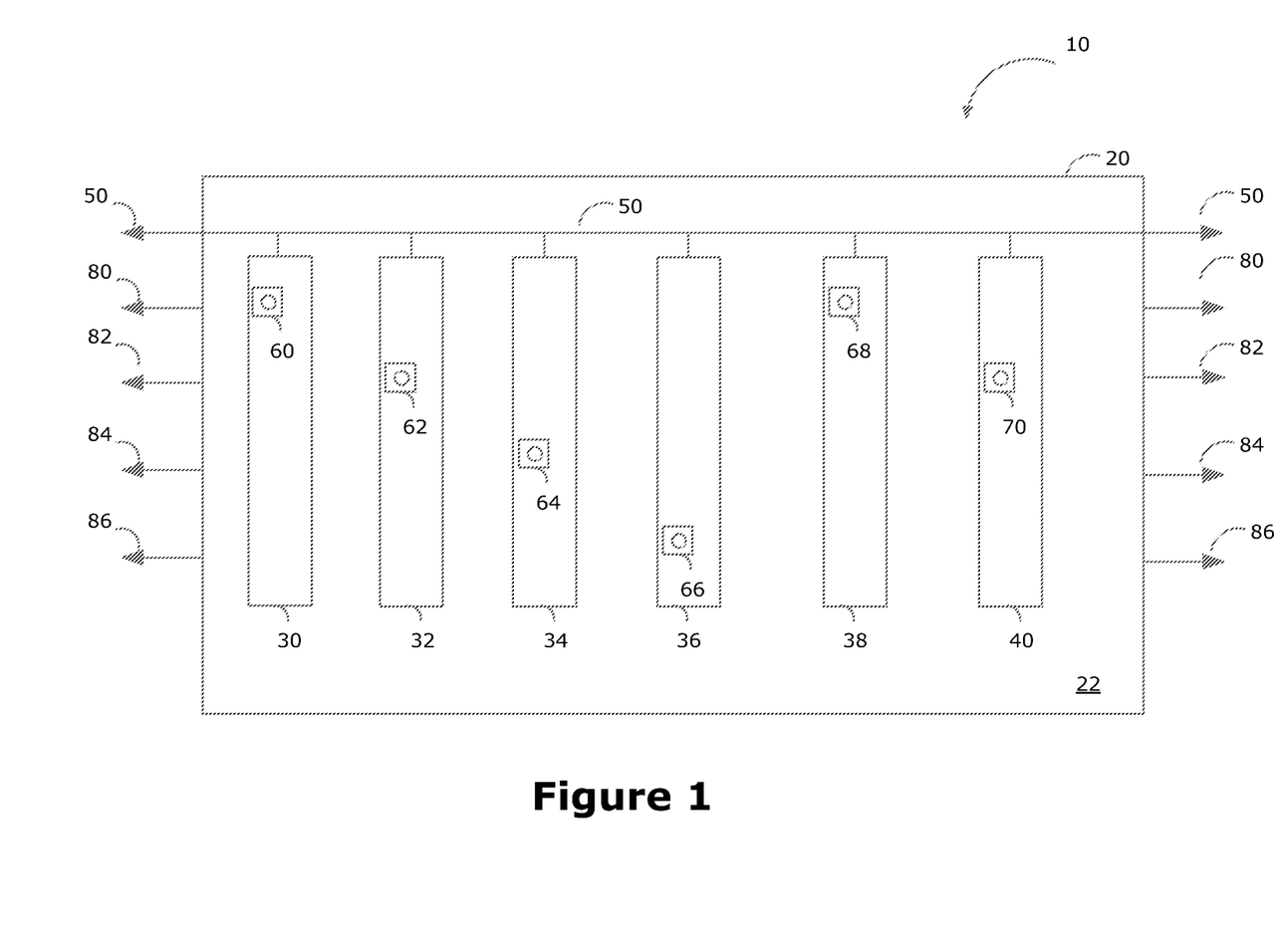
FIG. 1 is a schematic diagram illustrating the layout of one layer of an embodiment of the invention.

A schematic diagram of one layer of an embodiment of the invention is depicted in FIG. 1. Light engine 10 may be comprised of a substrate 20, for example, a metal core printed circuit board (PCB) or another suitable thermally conductive substrate, that may have an interconnection layer 22 to facilitate the attachment and interconnection or coupling of various components in a known manner. Light engine 10 may have a power supply input 50 that may be coupled to the output of a power supply to provide a source of power to light engine 10.

Light engine 10 may have a plurality of LED sets 30, 32, 34, 36, 38, and 40 coupled between power supply input 50 and a power supply return to allow a current to flow from the power supply through the various LED sets. Each LED set may be comprised of a single LED or a plurality of LEDs that may be connected in a number of different configurations. For example, each LED set may have a plurality of LEDs connected in series between power supply input 50 and the power supply return 114 (FIG. 5) as shown in greater detail in FIGS. 3 and 4. LED sets may also have different number of LEDs, depending on, for example, the forward voltage of the LEDs included in the LED set. The number of LEDs in each LED set may be chosen so that the combined total voltage across each of the LED sets is approximately equal.

Light engine 10 may also have at least one LED group that may be independently controlled by control unit 120 (FIG. 5) in certain embodiments of the invention. Each LED group may be comprised of at least one LED set. The layout of the LED sets in a LED group may vary depending on the particular application. For example, the LED sets making up a LED group may be repeated periodically along a length of light engine 10.

Figure 7:
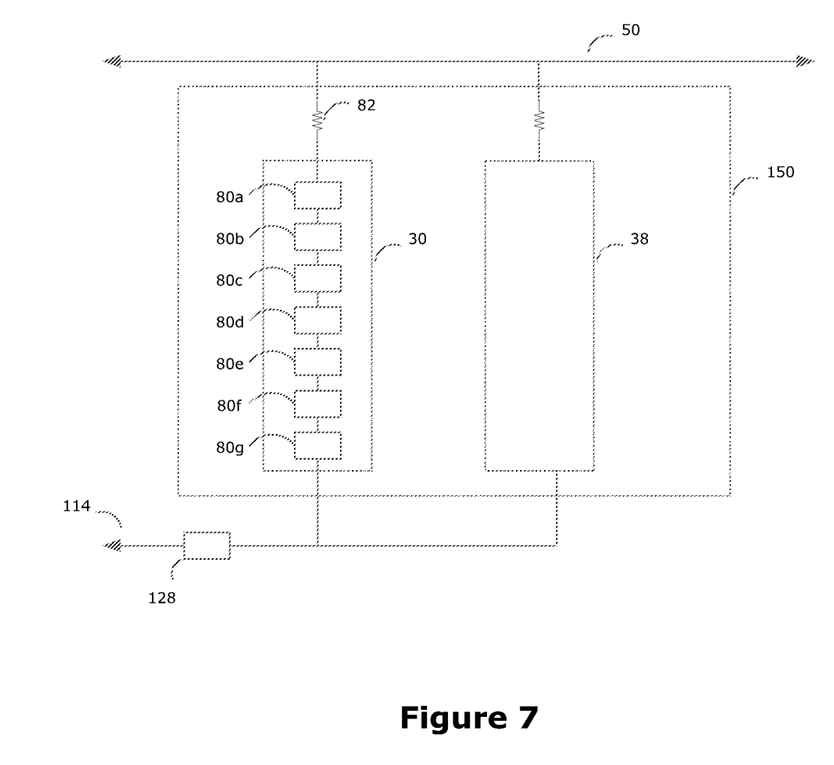
FIG. 7 is a schematic diagram illustrating one possible arrangement of LED groups and LED sets.

For example, with reference to FIGS. 1 and 7, LED group 150 may include LED sets 30 and 38. Similarly, another LED group (not shown) may include LED sets 32 and 40. The LED sets in a LED group may be repeated along a length of light engine 10 periodically depending on the number of LED groups employed in the light engine. For example, for a light engine having a modulo M architecture with M LED groups, each LED group may include every 1/Mth LED set. With reference to FIG. 1, each LED group may include every fourth LED set as four LED groups (not specifically enumerated) may be employed.

Figure 2:
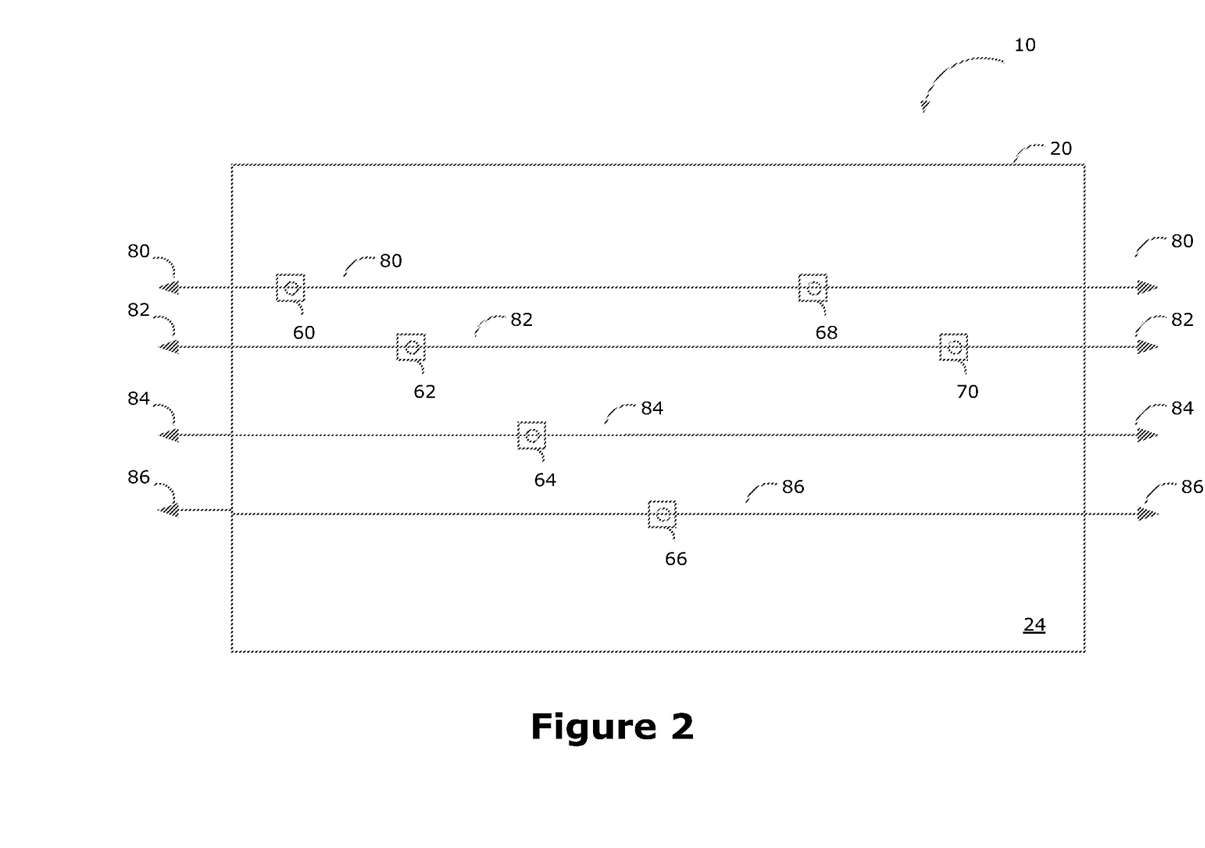
FIG. 2 is a schematic diagram illustrating the layout of another layer of the embodiment of the invention shown in FIG. 1.

Each LED group may have a return path associated with the LED group to complete the circuit to a power supply return 114 in order to allow a current to flow from power supply output 112 and through the LEDs of each LED group. In order to facilitate the independent control of each LED group, each LED group may have a separate return path. For example, LED group 150 may have LED sets 30 and 38 that may be coupled between power supply input 50 and return path 80. Similarly, LED sets 32 and 40 of a second LED group may be coupled to return path 82. LED sets 34 and 36 may be members of different LED groups and be coupled to return paths 84 and 86 respectively. LED sets mounted to and coupled together using interconnection layer 22 may be coupled to return paths disposed in another interconnection layer, interconnection layer 24, using layer interconnection elements, such as vias according to known methods. For example, LED sets 30 and 38 may be coupled to return path 80 using layer interconnection elements 60 and 68. Similarly, layer interconnection elements 62, 64, 66, and 70 may be employed to connect LED sets 32, 34, 36, and 40 to return paths 82, 84, 86, and 82 respectively. Generally, all LED sets in a particular LED group may be coupled to the same return path using layer interconnection elements at various points on light engine 10. Such a configuration allows the LED groups to be controlled independently as described below. Although, four return paths and LED groups are shown in light engine 10 any number of return paths and LED groups may be used, for example, eight LED groups may be used in certain applications.

Figure 3:
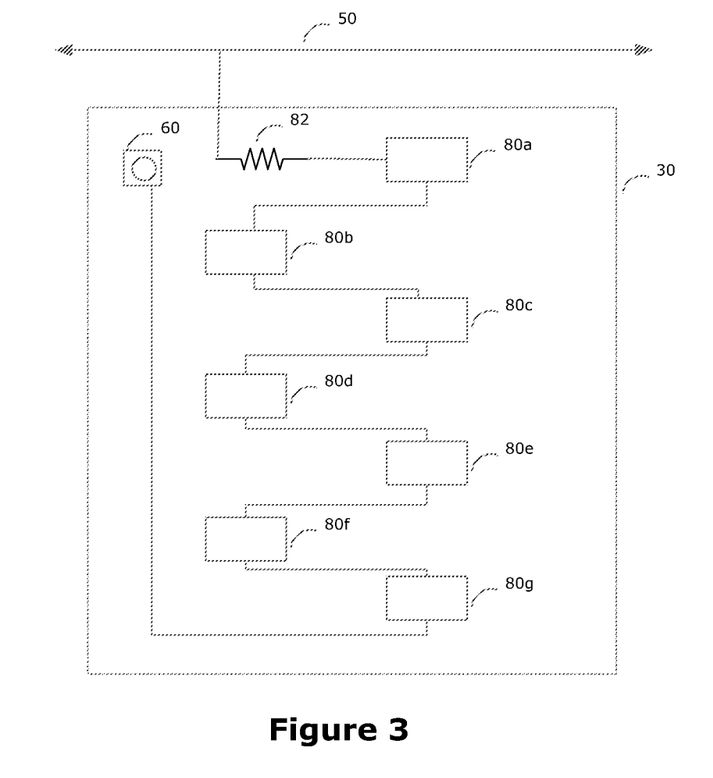
FIG. 3 is a schematic diagram illustrating the layout of an embodiment of a LED set in greater detail.

One particular embodiment of LED set 30 is shown in greater detail in FIG. 3. It should be noted that numerous other configurations may also be used without departing from the scope of the invention, including configurations where all LEDs in a LED set are not all coupled together in series. A resistor 82 may be coupled between power supply input 50 and a plurality of LEDs, for example LEDs 80*a*-80*g*, that may be connected in series in layer 22. LED 80*g* may also be coupled to layer interconnection element 60, which may be coupled to return path 80 in interconnection layer 24 to allow a current to flow from power supply input 50 through LEDs 80*a*-80*g*, through return path 80 to power supply return 114. Other LED sets in light engine 10 may have the same or different configurations depending on the particular application.

Figure 4:
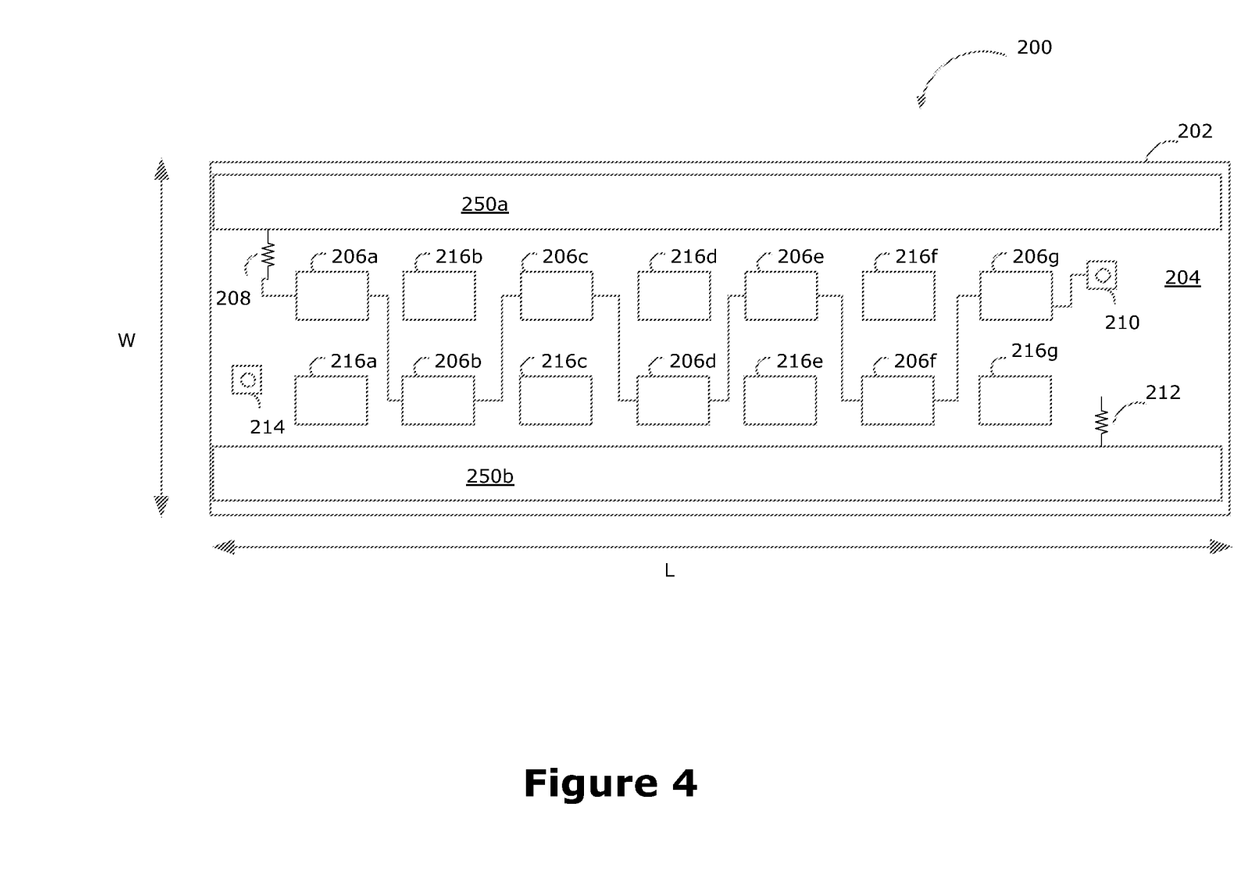
FIG. 4 is a schematic diagram of an alternative embodiment of a LED set.

Another embodiment of a LED set layout in light engine 200 is illustrated in FIG. 4. Light engine 200 may have a substrate 202, which may be a multi-layer metal core printed circuit board, and may have a first interconnection layer 204. Power supply inputs 250*a* and 250*b* may be configured to run adjacent to two edges of substrate 202 in layer 204. A plurality of LEDs may be mounted between power supply inputs 250*a* and 250*b* in a variety of configurations. For example, LEDs may be mounted in layer 204 in to parallel rows, parallel columns, diagonally, or in another arrangement. LED sets may be constructed by interconnecting LEDs from each row in an alternating pattern along the length of the rows. For example, a LED set may be constructed by coupling resistor 208 to power supply input 250*a*, coupling LEDs 206*a*-206*g* together in series, coupling LED 206*g* to layer interconnection element 210, and coupling layer interconnection element 210 to a return path (not shown) on another layer (not shown) of substrate 202. Similarly, another LED set may be constructed by coupling resistor 212 between power supply input 250*b*, coupling resistor 212 to LEDs 216*a*-216*g* in series, and coupling LED 216*g* to layer interconnection element 214. Layer interconnection element 214 may than be connected to a return path (not shown) to complete the circuit.

Light engine 200 may have additional LED sets (not shown) to form a plurality of LED groups. The LED sets in each LED group may be connected to a separate return path (not shown) associated with each LED group to allow each LED group to be controlled independently. In this configuration, power supply inputs 250*a* and 250*b* and return paths should be of a sufficient width to adequately handle the expected current, which may limit the width W of light engine 200. It may be desirable to design light engine 200 so that the length L is much greater than the width W so light engine 200 may approximate the dimensions of a fluorescent tube so that existing fluorescent encasements may be more readily modified for use with light engine 200. For example, the length L of light engine 200 may be at least ten times the width W. Similarly, it may be desirable to construct light engine 200 to have a narrow width of less than or equal to, for example, 1 or 2 inches.

It should be noted that the traces to implement power supply input 50 and return paths 80, 82, 84, and 86 of light engine 10 should be of a sufficient width to accommodate the expected current. For light engines having a large number of LEDs the width of the power supply input 50 and return paths 80, 82, 84, and 86 may limit the dimensions of the light engine and number of LEDs that may be mounted in a particular area. Employing a multi-layer metal core PCB may allow long and narrow light engines to be designed having a large number of LEDs because a second layer may be used for the return paths, allowing more space for power supply inputs and LEDs on a first layer. Moreover, the use of a MCPCB may allow a greater density of LEDs to be mounted to the light engine because MCPCBs have favourable thermal conduction properties.

Figure 5:
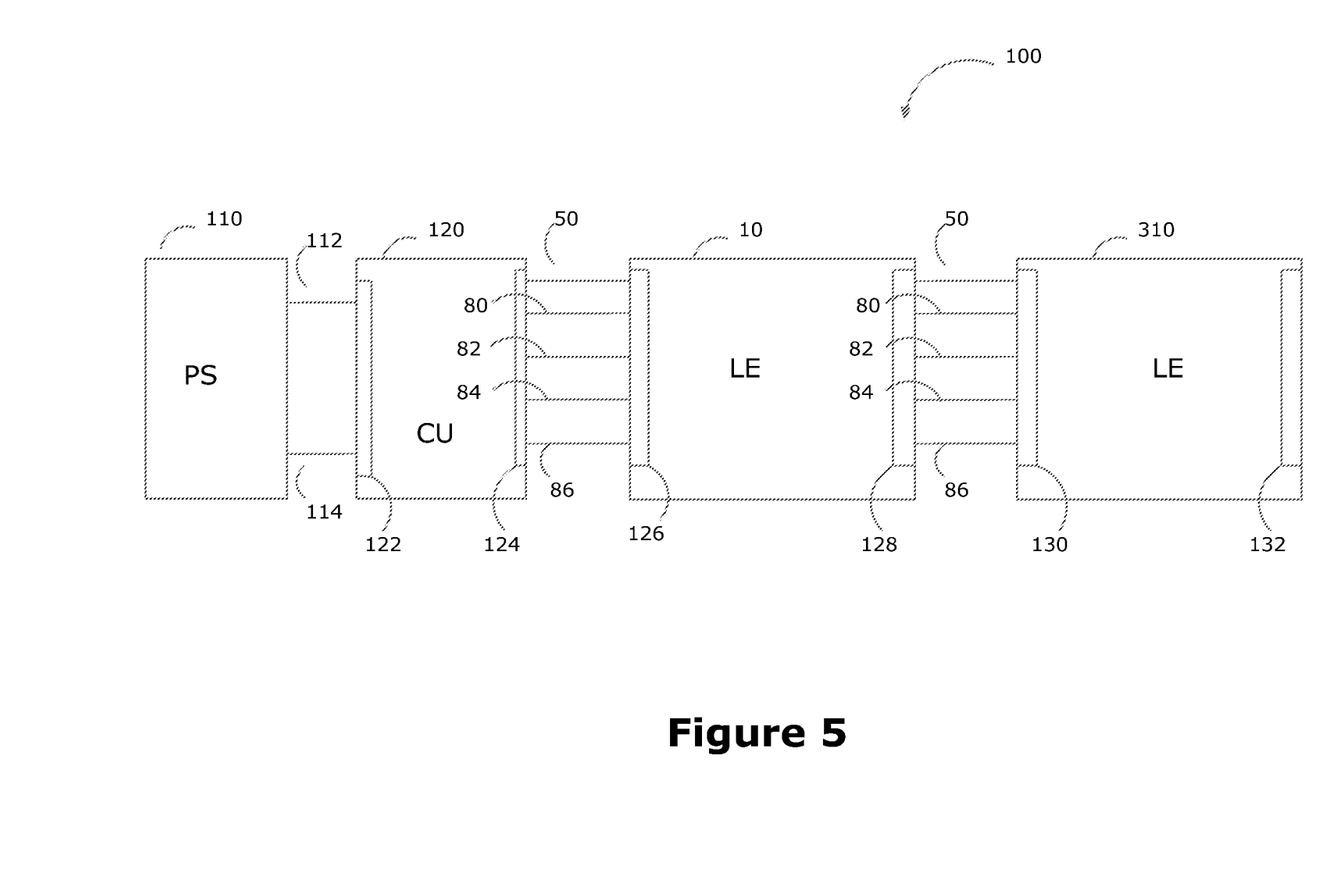
FIG. 5 is a schematic diagram of a lighting apparatus comprised of multiple light engines.
Figure 6:
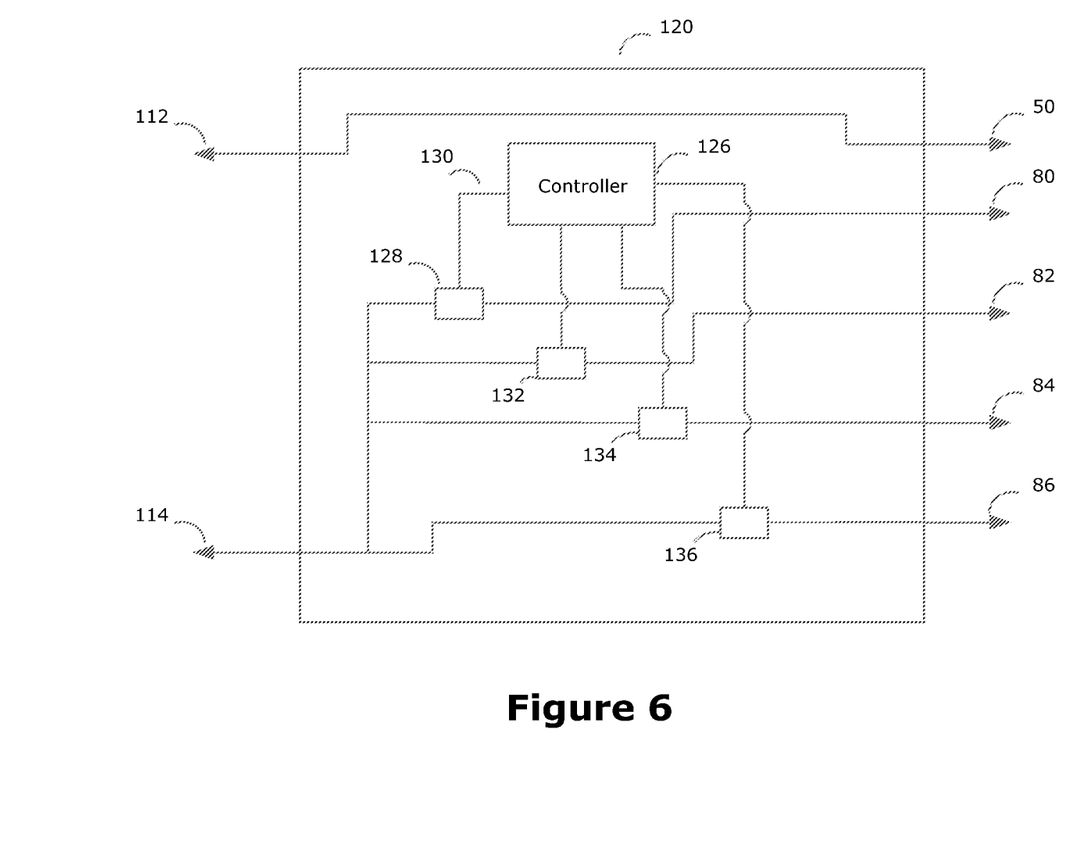
FIG. 6 is a schematic diagram of an embodiment of a control unit in greater detail.

A simplified schematic diagram of an embodiment of lighting apparatus 100 is illustrated in FIGS. 5 and 6. Lighting apparatus 100 may have a power supply 110 having a power supply output 112 and power supply return 114 coupled to control unit 120. Power supply 110 may be a constant voltage power supply or alternatively a constant current power supply in certain embodiments. Control unit 120 may be coupled to light engine 10 using mated connectors 124 of control unit 120 and connector 126 of light engine 10. The mated connectors may be connected together to allow power supply input 50, which may be coupled to power supply output 112 to be provided to light engine 10. The connectors may be chosen so that they may be physically connected and designed to minimize the space between control unit 120, light engine 10, and light engine 310 so that these components provide a more uniform light output and minimize any "dark" spots between light engines and provide a compact footprint for the lighting apparatus.

Connector 124 of control unit 120 may be a female connector adapted to be physically connected with male connector 126 of light engine 10. Connector 128 of light engine 10 may be a female connector adapted to be physically connected to male connector 130 of light engine 310. Such an arrangement allows either of light engines 10 or 310 to be physically connected to control unit 120 using connectors 126 or 130 and allows other light engines to be physically connected to light engines 10 or 310. This may increase the modularity of a lighting apparatus comprising light engines 10 and 310. In one embodiment, female connectors may be model no. 20-9159-005-101-116 or 22-9159-005-101-116 connectors and male connectors may be model no. 10-9159-005-101-116 connectors from AVX Corporation of South Carolina, U.S.A.

Similarly, connectors 124 and 126 may couple return paths 80, 82, 84, and 86 between light engine 10 and control unit 10 to provide a conductive path for each return path to power supply return 114. Light engine 10 may also have a connector 128 adapted to connect to connector 130 of light engine 310 so that power supply input 50 and return paths 80, 82, 84, and 86 may be coupled between light engines 10 and 310. Light engine 310 may also have a connector 132 that may be coupled to another light engine (not shown) in a similar fashion to maintain connectivity of power supply input 50 and return paths 80, 82, 84, and 86 between the various light engines. Additionally, more than three light engines may be coupled together in series and controlled by control unit 120. The coupling together of light engines in a modular fashion to be controlled by control unit 120 may increase the flexibility and decrease the cost of modifying lighting apparatus 100 for a particular application. For example, the modular design may reduce the number of SKUs of a manufacturer, which may simplify operations and reduce costs.

Light engines 10 and 310 may have the same or different configurations of LED groups and sets. Light engines 10 and 310 may be configured to have the same LED groups coupled to the same return path so that the LED groups on both of light engines 10 and 310 may be simultaneously controlled by control unit 120. Alternatively, other configurations of LED sets and LED groups may be employed in certain applications, noting that the control unit may be limited to simultaneously controlling LED sets coupled to each separate return path. Although four return paths are shown in FIG. 5, any other number of return paths may be used, for example, eight return paths may be used in certain applications. In certain embodiments, it may be possible to include four return paths in a light engine having a width of one inch and eight return paths in a light engine having a width of 1.75 inches.

One possible embodiment of control unit 120 is shown in FIG. 6 with details of the connectors omitted. Control unit 120 may be configured to couple power supply output 112 to power supply input 50 of light engine 10 to provide a source of power to light engine 10 and other light engines that may be coupled to light engine 10. Control unit 120 may also have a controller 126 connected to switching elements 128, 132, 134, and 136 so that controller 126 may selectively activate and deactivate each switching element to allow a current to flow from power supply output 112, through light engines 10 and 310, and back to power supply return 114. More specifically, switching element 128 may be coupled to activation output 130 of controller 126 so that a signal may be provided from controller 126 to selectively activate switching element 128 to allow a current to flow through return path 80. Switching elements 132, 134, and 136 may be configured in a similar manner to selectively allow current to flow through return paths 82, 84, and 86 respectively under the control of controller 126.

Switching element 128 may be implemented as a NMOS transistor having its gate coupled to activation output 130, its drain coupled to return path 80, and its source coupled to power supply return 114. When activation output 130 is set to high, the NMOS transistor may allow a current to flow from drain to source and similarly prevent a current from flowing when activation output is set to low in a known manner.

Control unit 120 may selectively activate all LED sets connected to each return path independently in this configuration. In embodiments where all LED sets in a particular LED group are all connected to the same return path, each LED group may be controlled independently by control unit 120. This may allow control unit 120 to provide a separate pulse width modulated (PWM) signal to each LED group. The ability to provide a separate PWM signal to each LED group may reduce the load on the power supply as certain algorithms may be used by controller 126 to minimize the current variation by staggering the PWM signal provided to each LED group compared to simultaneously turning on and off all LED groups at once. One possible algorithm to reduce the variation of the current supplied by power supply 110, where power supply 110 is a constant voltage power supply, is described in U.S. patent application Ser. No. 12/624,414 to Briggs which was published May 27, 2010 as U.S. Patent Application Publication No. 2010/0127632, which is incorporated by reference.

The ability to independently control LED groups may provide a number of advantages. For example, light engine 200 may have at least one LED set having a different colour or colour temperature from the remaining LED sets. For example, LEDs 206a-206g of a first LED set may be a first colour and LEDs 216a-216g of a second LED set may be a second colour. These LED sets may be included in different LED groups and be controlled separately so that the colour or colour temperature emitted by light engine 200 may be varied by control unit 120. For example, control unit 120 may control one LED group so that it has an increased duty cycle to increase the relative intensity of a particular spectrum of light being emitted by light engine 200. Alternatively, the PWM signals applied to each LED group may be offset to adjust the light output from light engine 200.

In certain embodiments at least one LED from at least two different LED groups may be mounted on light engine 10 or light engine 200 to be adjacent to or in close proximity to each other. More specifically, at least one LED from at least two different LED groups may be mounted so that the light radiated from these LEDs at least partially overlaps before the emitted light reaches optics (not shown) in a lighting apparatus. The lighting apparatus may also be constructed with particular optics to optimize the mixing of light having different colours or colour temperatures according to methods known in the art. This may allow for a more uniform light output from the lighting apparatus while allowing mixing of the emitted light where all or a subset of LEDs from at least two different LED groups have different colours or colour temperatures. For example, with reference to FIG. 4, LED 206a from a first LED group may be mounted adjacent to or in close proximity to LEDs 216a and 216b of a second LED group so that the light emitted from LED 206a at least partially overlaps with the light emitted from LEDs 216a and 216b. Similarly, it may be advantageous to intertwine individual LEDs of different LED groups and sets as shown in FIG. 4, where LEDs in each LED set are coupled together from alternating rows, to optimize the quality of light output from light engine 200 when the colour, colour temperature, or other parameters are adjusted.

Figure 8:
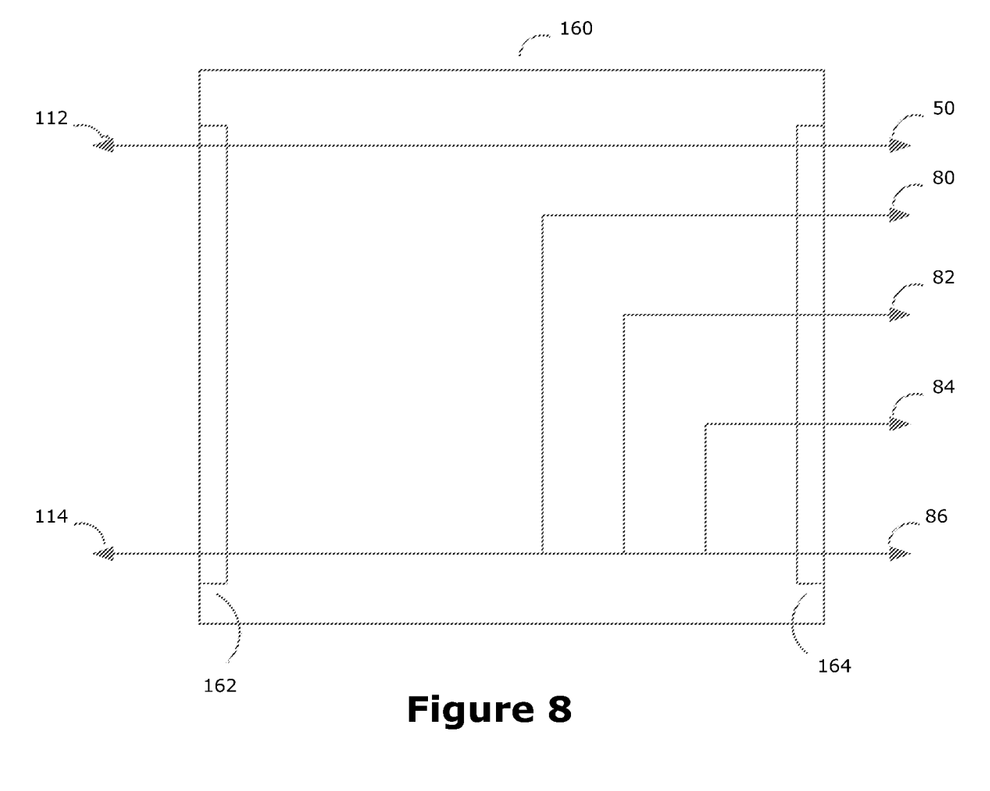
FIG. 8 is a schematic diagram of an embodiment of a pass through board that may be used in certain embodiments of the invention.

Alternatively, in certain embodiments of the invention, control unit 120 may be omitted and replaced with pass through board 160. In these embodiments, LED groups may not be controlled independently and are simply provided with the signal from power supply output 112. Power supply 110 may provide a continuous power output or in certain embodiments be a switching power supply operable to provide a PWM signal. Pass through board 160 may be coupled to power supply 110 using connector 162 and light engine 10 using connector 164 so that power supply output 112 may be coupled to power supply input 50 of light engine 10. Connector 164 may also facilitate the coupling of return paths 80, 82, 84, and 86 from light engine 10 to power supply return 114 via connector 162. Return paths 80, 82, 84, and 86 may be coupled together on pass through board 160 so that a single return path is provided to power supply return 114. Pass through board 160 may allow a lighting apparatus to be constructed in a modular fashion and allows the same light engine architecture to be used for applications that require a control unit and those that do not require control. This may reduce costs and simplify the manufacturing process.

Alternatively, a lighting apparatus may be constructed having the functionality of control unit 120 or pass through board 160 on the same substrate as a light engine. Such a light engine may or may not be adapted to be coupled together with another light engine and be controlled by the controller mounted to the first light engine. This modified architecture maintains a degree of modular architecture and may simplify the manufacturing process and reduce costs in a similar fashion to that noted above.

A further alternative embodiment, may have control unit 120 located in a remote location or elsewhere in the encasement of a lighting apparatus and connected to at least one light engine via a cable rather than being physically connected to one end of a light engine as shown in FIG. 5. For example, control unit 120 may be located below the light engine or elsewhere in certain embodiments of a lighting apparatus. The control unit may continue to be able to control a plurality of light engines that may be coupled together as shown in FIG. 5 in a similar manner.

Another embodiment of the invention may include switching elements that may be controlled by controller 126, between power supply output 112 and the LED groups of light engine 10, instead of having the switching elements coupled between the return paths and the power supply return 114. In this embodiment, separate power supply inputs would be provided to the LED sets of each LED group and all LED sets may share a common return path or use a plurality of return paths. For example, the control unit illustrated in FIG. 6 could be modified to use the power supply input 50 as a return path that would be connected to power supply return 114 rather than power supply output 112. Similarly, return paths 80, 82, 84, and 86 may be used as power supply inputs to each LED group and be coupled to power supply output 112 instead of power supply return 114. Switching elements may be modified to use PMOS transistors connected between the power supply output 112 and LED groups, with a suitable voltage divider controlled by a transistor coupled to the gate of each PMOS transistor, so that each PMOS transistor may selectively allow a current to flow through each switching elements depending on the output of an activation output of controller 126 in a known manner. Such a configuration using a second layer to provide power inputs to each LED group may similarly allow a high density of LEDs to be mounted to a light engine.

Moreover, it should be noted that further configurations of the control unit may be utilized provided each LED group may be independently controlled by the control unit without departing from the scope of the invention.

When introducing elements of the present invention or the embodiments thereof, the articles "a," "an," "the," and "said" are intended to mean that there are one or more of the elements. The terms "comprising," "including," and "having" are intended to be inclusive and mean that there may be additional elements other than the listed elements. Of course, the above described embodiments are intended to be illustrative only and in no way limiting. The described embodiments of carrying out the invention are susceptible to many modifications of form, arrangement of arts, details and order of operation. The invention, rather, is intended to encompass all such modification within its scope, as defined by the claims.

What is claimed is:

1. A light engine comprising:
   a printed circuit board;
   a plurality of LED groups on said printed circuit board coupled between a power supply input and a respective one of a plurality of return paths associated with said LED group;
   each of said LED groups comprising a plurality of LED sets coupled in parallel; each of said LED sets comprising a plurality of LEDs coupled in series; wherein a first one of said LED groups is comprised of at least a subset of LEDs having a first colour temperature, and a second one of said LED groups is comprised of at least a subset of LEDs having a second colour temperature different from said first colour temperature; wherein at least one of said LEDs having a first colour temperature from said first LED group and at least one of said LEDs having a second colour temperature from said second LED group are intertwined on said light engine.

2. The light engine of claim 1, wherein each of said plurality of LED groups are coupled between the power supply input and the return path associated with said LED group; and said return path is coupled to a power supply return.

3. The light engine of claim 2, wherein one of a plurality of switching elements is coupled between each of said return paths and said power supply return, said switching elements operable to selectively control a current through said LED group associated with said return path.

4. A lighting apparatus comprising the light engine of claim 1 and: a control unit coupled between said plurality of LED groups and a power source; said control unit operable to selectively activate each of said LED groups to provide a light output.

5. The lighting apparatus of claim 4, said control unit comprising: a controller coupled to a plurality of switching elements; one of said plurality of switching elements coupled between each of said return paths and a power supply return, wherein said controller is operable to selectively activate each of said switching elements to allow a current to flow from a power supply input through said associated LED group to said power supply return.

6. The lighting apparatus of claim 5, said control unit implemented on a separate printed circuit board having a connector adapted to be physically connected to a first connector of said light engine.

7. A lighting apparatus comprising the light engine of claim 1 and a pass through board adapted to be coupled between said light engine and a power source, said pass through board adapted to couple each of said return paths together and provide a single input to a return terminal of said power source.

8. A lighting apparatus comprising at least two light engines according to claim 1, said light engines adapted to be physically connected to maintain a connection path between each of said return paths.

9. A lighting apparatus comprising the light engine according to claim 1, wherein at least one of said LEDs having a first colour temperature from said first LED group and at least one of said LEDs having a second colour temperature from said second LED group are mounted so that the light emitted from said LEDs overlaps before reaching an optics section of said lighting apparatus.

10. A light engine comprising:
a printed circuit board;
a plurality of LED groups on said printed circuit board coupled between a respective one of a plurality of power supply inputs associated with said LED group and a return path;
each of said LED groups comprising a plurality of LED sets coupled in parallel; each of said LED sets comprising a plurality of LEDs coupled in series; wherein a first one of said LED groups is comprised of at least a subset of LEDs having a first colour temperature, and a second one of said LED groups is comprised of at least a subset of LEDs having a second colour temperature different from said first colour temperature; wherein at least one of said LEDs having a first colour temperature from said first LED group and at least one of said LEDs having a second colour temperature from said second LED group are intertwined on said light engine.

11. The light engine of claim 10, wherein each of said plurality of LED groups are coupled between the power supply input associated with said LED group and the return path; and said power supply input is coupled to a power supply output.

12. The light engine of claim 11, wherein one of a plurality of switching elements is coupled between each of said power supply inputs and said power supply output, said switching elements operable to selectively control a current through said LED group associated with said power supply input.

13. A lighting apparatus comprising the light engine of claim 10 and: a control unit coupled between said plurality of LED groups and a power source; said control unit operable to selectively activate each of said LED groups to provide a light output.

14. The lighting apparatus of claim 13, said control unit comprising: a controller coupled to a plurality of switching elements; one of said plurality of switching elements coupled between each of said power supply inputs and a power supply output, wherein said controller is operable to selectively activate each of said switching elements to allow a current to flow from said power supply input through said associated LED group to a power supply return.

15. The lighting apparatus of claim 14, said control unit implemented on a separate printed circuit board having a connector adapted to be physically connected to a first connector of said light engine.

16. A lighting apparatus comprising the light engine of claim 10 and a pass through board adapted to be coupled between said light engine and a power source, said pass through board adapted to couple each of said power supply inputs together and provide a single input to an output terminal of said power source.

17. A lighting apparatus comprising at least two light engines according to claim 10, said light engines adapted to be physically connected to maintain a connection path between each of said power supply inputs.

18. A lighting apparatus comprising the light engine according to claim 10, wherein at least one of said LEDs having a first colour temperature from said first LED group and at least one of said LEDs having a second colour temperature from said second LED group are mounted so that the light emitted from said LEDs overlaps before reaching an optics section of said lighting apparatus.

19. A lighting apparatus comprising:
an optics section; and
at least one light engine comprising: a printed circuit board; and a plurality of LED groups on said printed circuit board coupled between a power supply input and a respective one of a plurality of return paths associated with said LED group; each of said LED groups comprising a plurality of LED sets coupled in parallel; each of said LED sets comprising a plurality of LEDs coupled in series; wherein a first one of said LED groups is comprised of at least a subset of LEDs having a first colour temperature, and a second one of said LED groups is comprised of at least a subset of LEDs having a second colour temperature different from said first colour temperature; wherein at least one of said LEDs having a first colour temperature from said first LED group and at least one of said LEDs having a second colour temperature from said second LED group are mounted so that the light emitted from said LEDs overlaps before reaching the optics section of said lighting apparatus.

20. A lighting apparatus comprising the light engine according to claim 19, wherein at least one of said LEDs having a first colour temperature from said first LED group and at least one of said LEDs having a second colour temperature from said second LED group are intertwined on said light engine.

* * * * *